US006760218B2

(12) United States Patent
Fan

(10) Patent No.: US 6,760,218 B2
(45) Date of Patent: Jul. 6, 2004

(54) HOUSING OF NETWORK DEVICE

(75) Inventor: Shu-Chu Fan, Hsinchu (TW)

(73) Assignee: D-Link Corporation, Hsinchu (TW)

( * ) Notice: Subject to any disclaimer, the term of this patent is extended or adjusted under 35 U.S.C. 154(b) by 0 days.

(21) Appl. No.: 10/267,582

(22) Filed: Oct. 10, 2002

(65) Prior Publication Data

US 2004/0069518 A1 Apr. 15, 2004

(51) Int. Cl.⁷ ................................................ H05K 7/14
(52) U.S. Cl. ..................... 361/683; 361/735; 312/223.2
(58) Field of Search ......................... 361/683, 685–687, 361/724–727, 681, 735, 801, 807; 165/104.33, 104.22; 312/253, 255, 223.2, 226.4

(56) References Cited

U.S. PATENT DOCUMENTS 5,864,467 A * 1/1999 Recchia et al. ............. 361/732
6,085,925 A * 7/2000 Chung ........................ 220/4.02
6,328,612 B1 * 12/2001 Chung ........................ 439/717
6,567,275 B1 * 5/2003 Hou et al. ................... 361/807
6,597,567 B2 * 7/2003 Stone et al. ................. 361/683

* cited by examiner

Primary Examiner—Dean A. Reichard
Assistant Examiner—Carmelo Oliva
(74) Attorney, Agent, or Firm—Bacon & Thomas PLLC

(57) ABSTRACT

The present invention is to provide a network device having a parallelepiped housing comprising a plurality of slots on two opposite sides and two opposite edges at each of an underside and a top and a plurality of pads each fastened the slots to form a short distance between a supporting surface and the underside of the housing by the projected pad. Also, housings of the same type of network devices can be stacked or horizontally coupled together by fastening the pads in the slots to form a gap between two stacked housings by the coupled pads for dissipating heat of the housings therefrom.

9 Claims, 8 Drawing Sheets

HOUSING OF NETWORK DEVICE

FIELD OF THE INVENTION

The present invention relates to network devices and more particularly to a housing structure of such network device with improved characteristics.

BACKGROUND OF THE INVENTION

Typically, each of the various commercially available network devices such as hubs, switches, modems, printer servers, gateways, and ISDNs (Integrated Services Digital Networks) has a housing. In one configuration a plurality of such network devices are coupled to a computer. Hence, a user can operate the computer to access the Internet by means of the coupled network devices. However, it is obvious that such plurality of network devices can occupy a considerable portion of limited space on or around the user's desk. Further, one network device may have a different size and/or shape from the other. Hence, the network devices cannot be orderly stacked. In fact, they are messy. This can cause difficulty in detecting, maintaining, and managing the network devices.

A commercially available network product having a stackable structure is shown in FIGS. 1 and 2. the network product comprises a parallelepiped housing 1 having an arcuate projection 10 on a top side, the projection 10 having a straight side recessed from the corresponding side and perpendicular to other two sides of the housing 1, a tab 12 on either side of the projection 10, a plurality of slits 14 on the projection 10 at one of two other sides, two parallel bottom seats 11, two opposite slits 13 each at the seat 11, and a rib 15 between the seats 11 being disposed corresponding to one of the slits 14. Thus, one housing 1 can be stacked on the other one having the same structure by matingly coupling.

Another commercially available network product having a stackable structure is shown in FIGS. 3 and 4. the network product comprises a parallelepiped housing 2 having an arcuate projection 20 on a top side adjacent one edge, the projection 20 having a first finger-shaped dent 22, a recess 21 on the top side adjacent the other opposite edge, the recess 21 having an indent 23, a lengthwise wave-shaped section 24 about at a center on the top side, and a plurality of recessed portions 26 at valleys of the wave-shaped section 24. the housing 2 further comprises, at the other side opposite to the projection 20, a first finger-shaped protrusion 25, a second finger-shaped protrusion 27 disposed corresponding to the recess 21, and two protuberances 29 disposed corresponding to the recessed portions 26. Thus, one housing 2 can be stacked on the other one having the same structure by matingly coupling.

However, the network product is disadvantageous for being complicated in design, having a plurality of components of different shapes, being difficult to manufacture, consuming more material, and being expensive in manufacturing. All of these contradict the trend of cost effective and high efficiency of the hi-tech oriented society. Thus improvement exists.

SUMMARY OF THE INVENTION

An object of the present invention is to provide a network device having a parallelepiped housing comprising a plurality of slots on two opposite sides and two opposite edges at each of an underside and a top and a plurality of pads each fastened the slots. This forms a short distance between a supporting surface and the underside of the housing by the projected pad. Also, housings of the same type of network devices can be stacked or horizontally coupled together by fastening the pads in the slots to form a gap between two stacked housings by the coupled pads for dissipating heat of the housings therefrom. By utilizing this, it is not only possible of stacking or horizontally coupling together the housings but also effect a good heat dissipation.

DETAILED DESCRIPTION OF THE PREFERRED EMBODIMENTS

Figure 1:
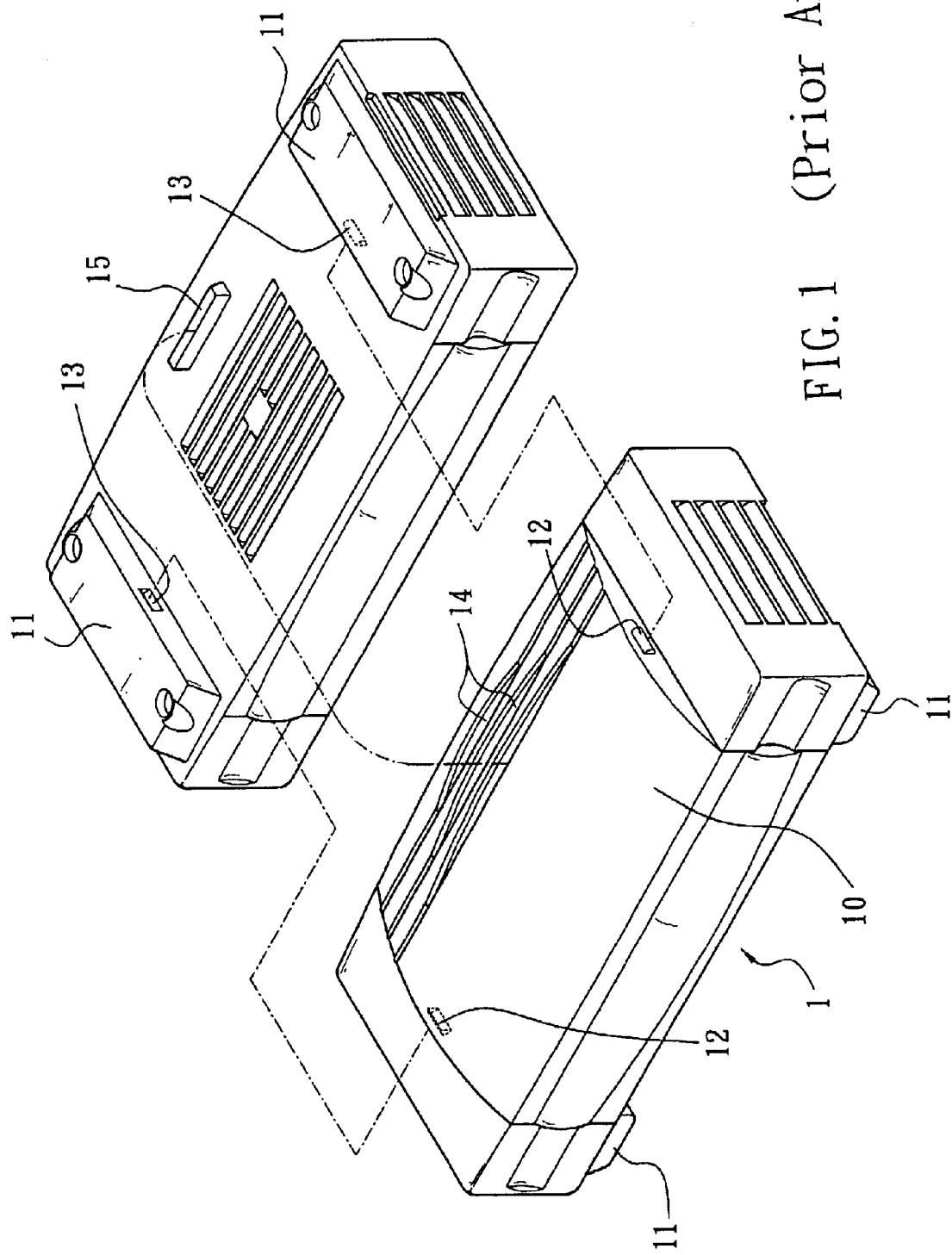
FIG. 1 is a perspective view showing top and bottom sides of a conventional network device.
Figure 2:
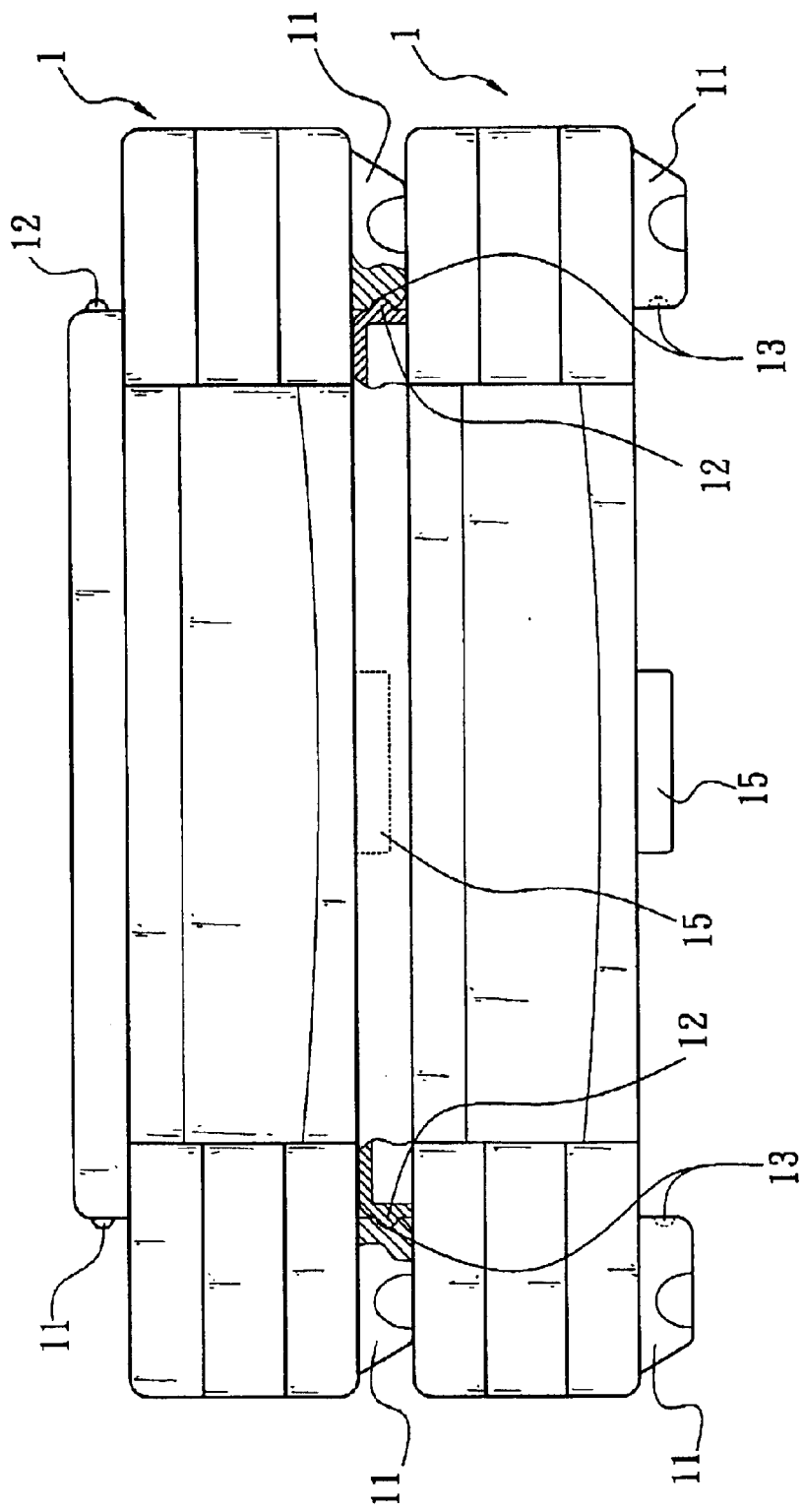
FIG. 2 is a side view in part section of the stacked network devices.
Figure 3:
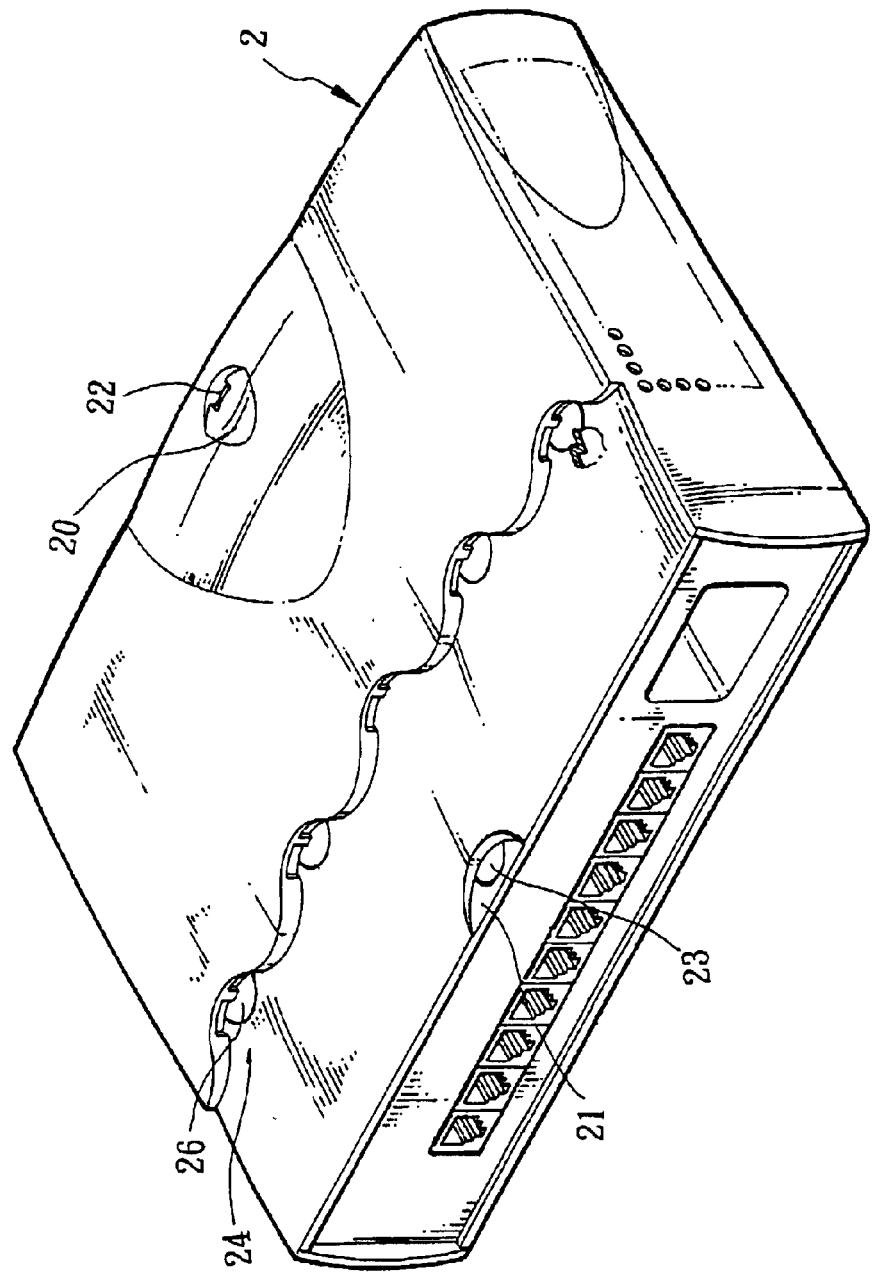
FIG. 3 is a perspective view showing a top side of another conventional network device.
Figure 4:
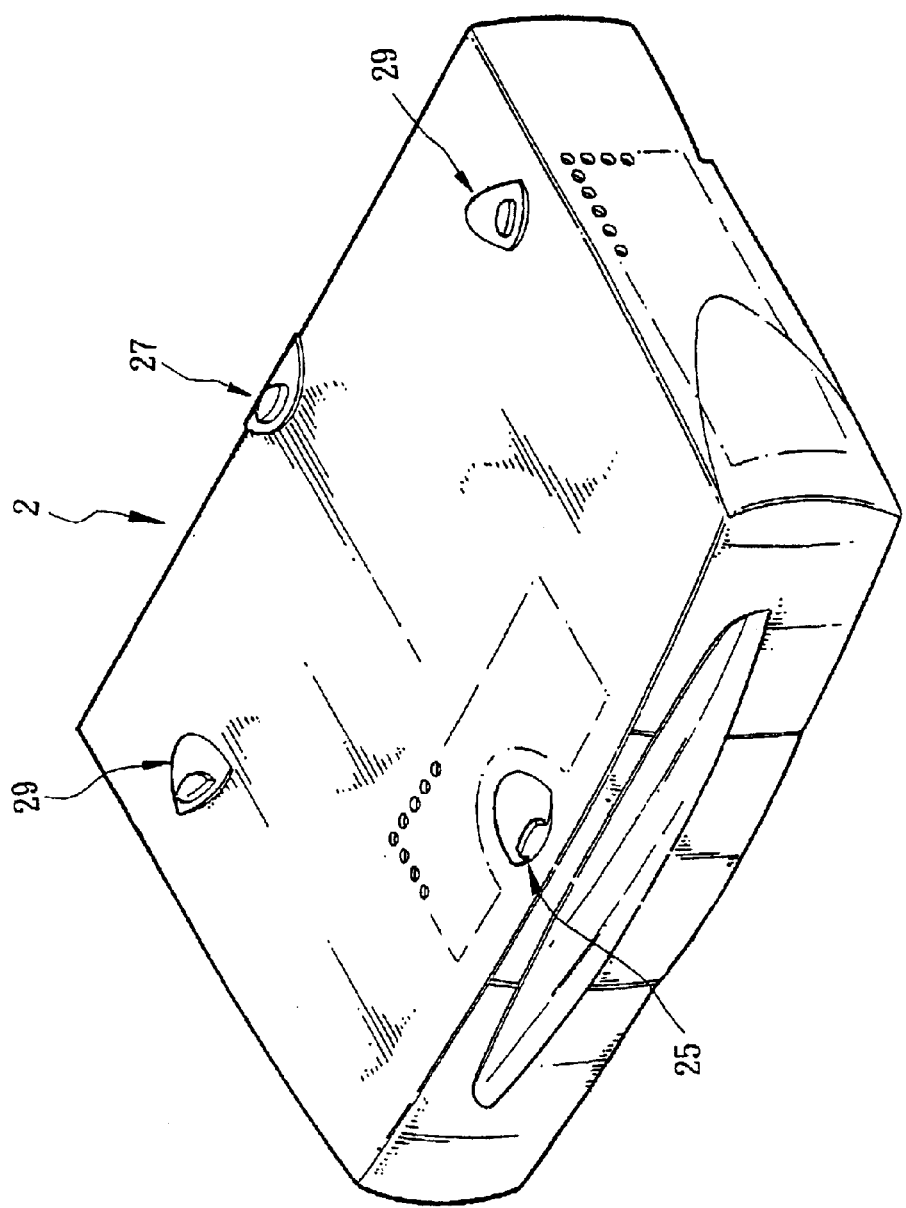
FIG. 4 is a similar view showing a bottom side of the network device of FIG. 3.

Referring to FIGS. 5, 6, 7, and 8, there is shown a network device having a housing 3 constructed in accordance with the invention. The housing 3 is a parallelepiped and comprises a plurality of slots 30 on two opposite sides and two opposite edges at each of an underside and a top and a plurality of pads 4 each fastened to two slots 30. The pad 4 is a cross-shaped member and comprises a central horizontal bar 40, an upper upright 42, and a lower upright 44. In installing the pad 4 in the slot 30 insert the upper upright 42 into and secure to the slot 30 with the bar 40 and the lower upright 44 projected from the underside of the housing 3. This forms a projection (i.e., the thickness of the bar 40 plus that of the lower upright 44) for resting the housing 3 above a supporting surface by a predetermined distance. In the invention there is provided at least one circuit board 32 in the housing 3. The circuit board 32 has a variety of electronic components 34 mounted thereon. The electronic components 34 are enabled to generate signals for connecting to a network (e.g., the Internet) in a normal operation. In addition, a display panel 36 and a plurality of ports 38 are formed on a side of the housing 3 without the provision of the slots 30. The display panel 36 comprises a plurality of light emitting elements 362 electrically coupled to the circuit board 32. Thus, a user can understand the status of an operating network device by observing the light emitting elements 362. A cable 5 for signal communication is interconnected between one port 38 on the housing 3 of the network device and an electronic device 6. Also, another cable 5 is interconnected between the other port 38 and a second network device 7. As such, the electronic device 6 and the second network device 7 are coupled together for signal communication and processing. Moreover, heat generated by the electronic components 34 in the housing 3 is transferred to a surface of the housing 3. Next, heat is dissipated from the surface of the housing 3 to the outside by convection. This can prevent too much heat from being accumulated in the housing 3. Otherwise, the network device may be damaged due to overheat.

Figure 5:
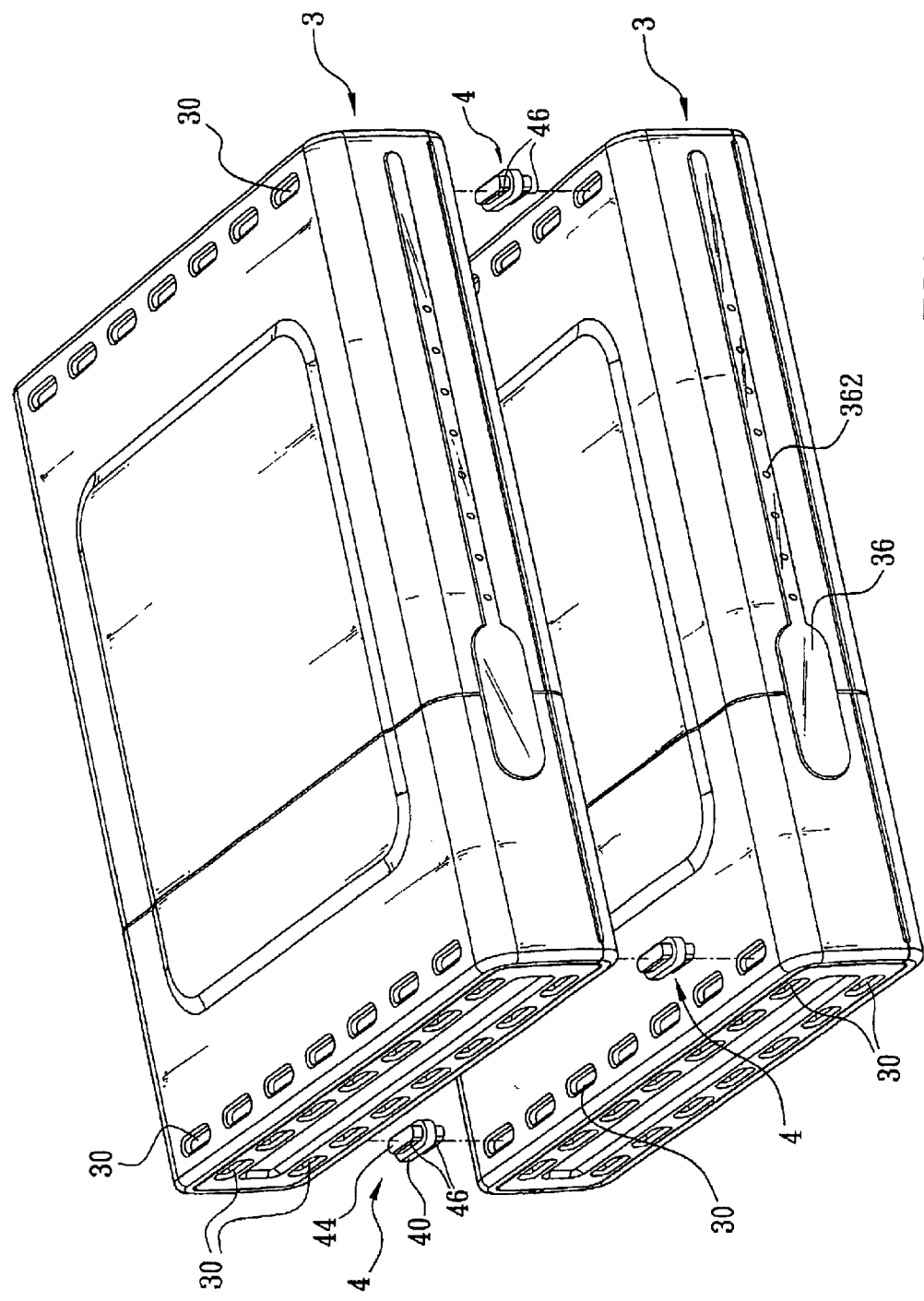
FIG. 5 is a perspective view of two network devices according to the invention before stacked.
Figure 6:
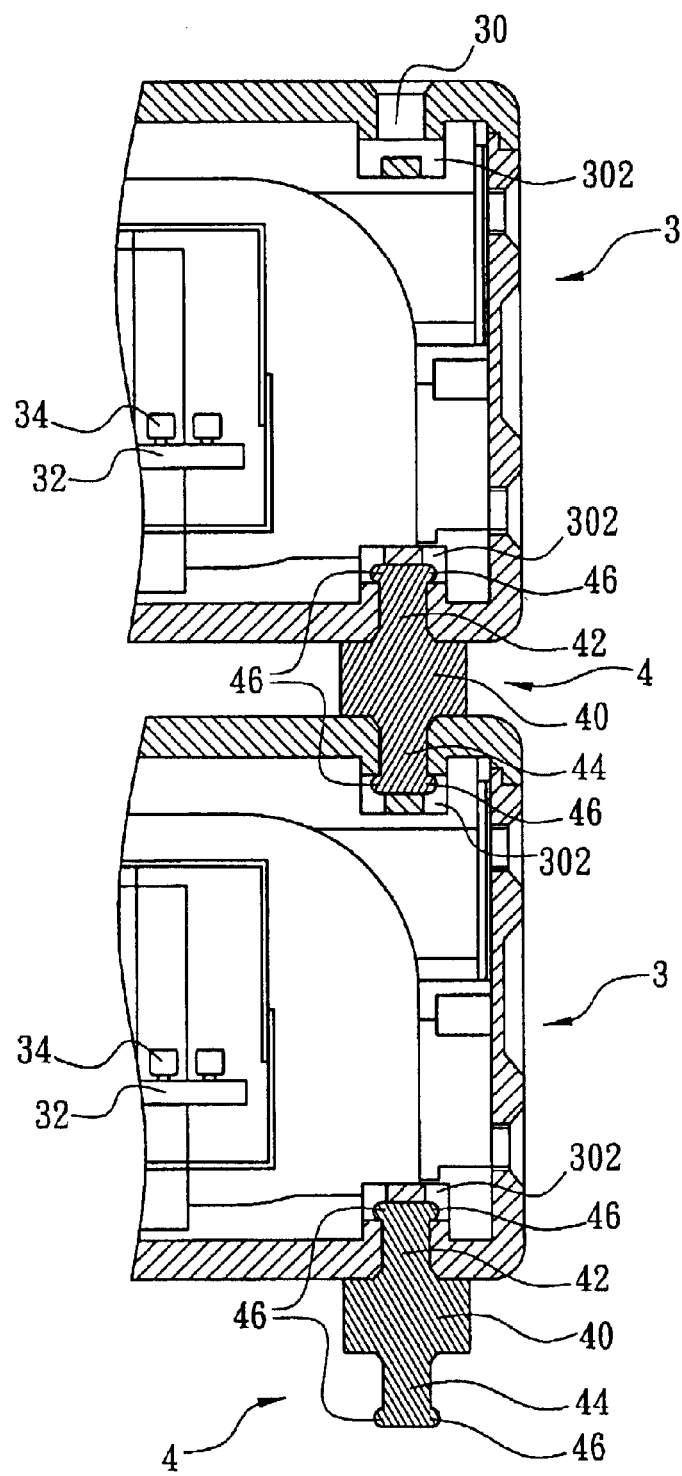
FIG. 6 is a sectional view showing two stacked network devices.

Referring to FIGS. 5 and 6 specifically, an operation of stacking or horizontally coupling the housings 3 of a plurality of network devices together is detailed below. Insert the lower upright 44 of the pad 4 (which is already coupled to one housing 3) into a corresponding slot 30 of another housing 3. Thus, the housings 3 of the network devices can be stacked or horizontally coupled together by fastening the pads 4 in this manner. Also, two adjacent housings 3 are separated by another predetermined distance as provided by the bar 40 of the coupled pad 4. As such, heat generated by the electronic components 34 in the housings 3 is transferred to surfaces of the housings 3. Next, heat is dissipated from the facing surfaces of the housings 3 to the outside by convection without accumulation in the housings 3. This technique of stacking or horizontally coupling the housings 3 of the network devices together is quick and convenient. Further, each of the slot 30 and the pad 4 has a simple structure. Hence, the invention can eliminate conventional disadvantages such as complicated components and difficult manufacturing. Moreover, a plurality of network devices having the housing structure of the invention not only can be stacked as well-known but also can be horizontally coupled together.

However, it is also found that a rate of the heat dissipation by convection from surface is too slow. Further, there is a possibility that the electronic components in the housing 3 may be damaged in such undesired heat dissipation environment. Hence, in the invention an opening 302 is provided in either an inner wall having the provision of the slots 30 distal from one side of the housing 3 or at a junction of the bottom and the inner wall of the slots 30 as referring to FIG. 6. Hence, only several ones of the slots 30 on the housing 3 are coupled to the pads 4. This can maintain a stable seating of the housing 3 on the supporting surface. As to the opening 302 in the other slots 30 on the housing 3 disconnected from the pad 4 is open to the outside so that heat generated in the housing 3 can be transferred to air. Moreover, a position at an edge of the opening 302 coupled to the bottom of the slots 30 is perpendicular to the side of the slots 30. Thus, spark generated by the malfunctioned electronic components in the housing 3 cannot fall out of the housing 3 from the opening 302.

Figure 7:
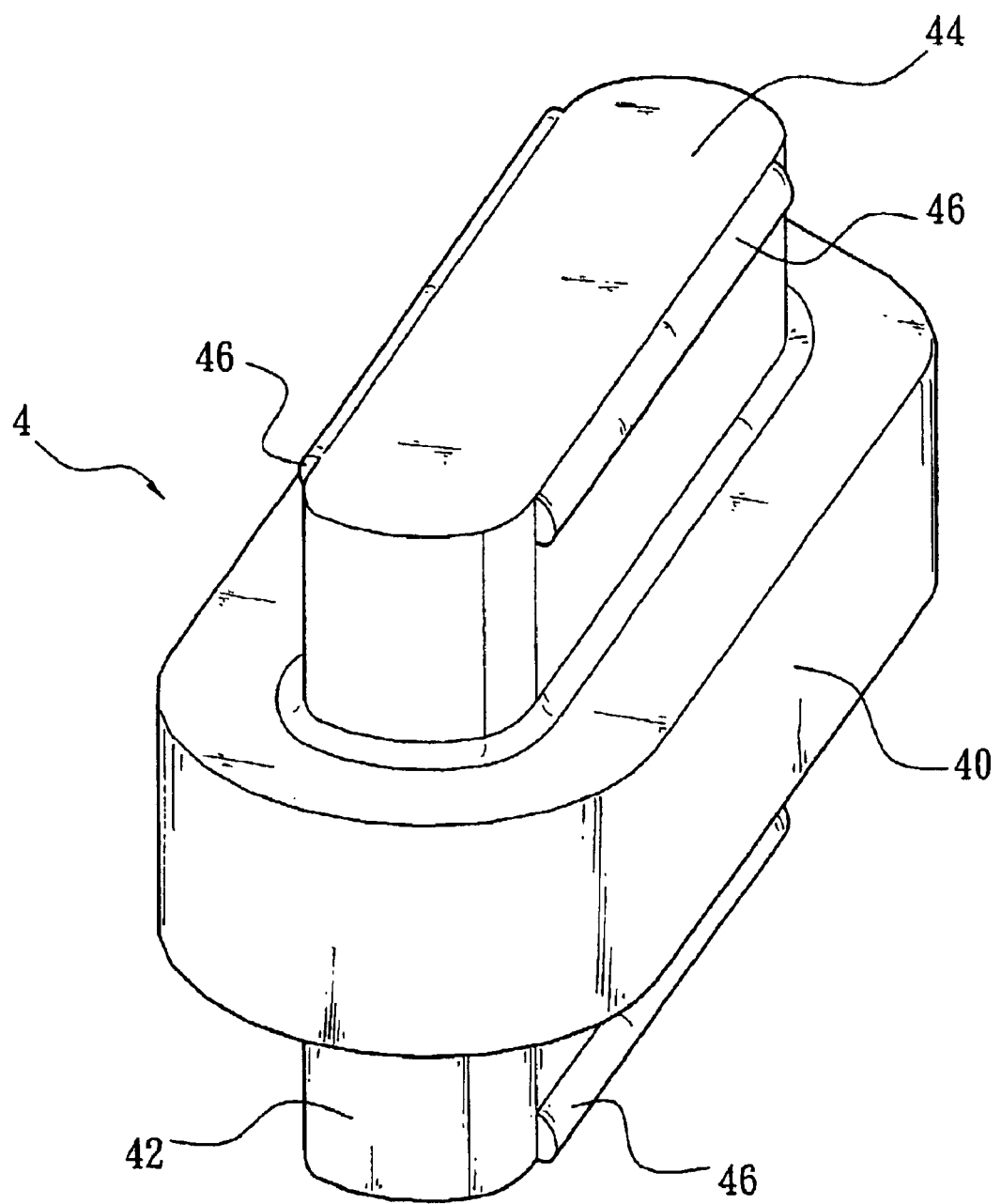
FIG. 7 is a perspective view of pad shown in FIG. 5.

For facilitating a fastening of the pad 4 in the slots 30 or removing the same from the slots 30, the pad 4 preferably is formed of a flexible material Also, in the invention a ridge 46 is formed at either side of each of the uprights 42 and 44 of the pad 4 for avoiding the pad 4 from being easily disengaged from the slots 30 as referring to FIGS. 6 and 7. With this configuration, the ridges 46 are urged against inside of the opening 302 after the pad 4 has been inserted into the slots 30. This can prevent the pad 4 from disengaging the slots 30 easily.

Figure 8:
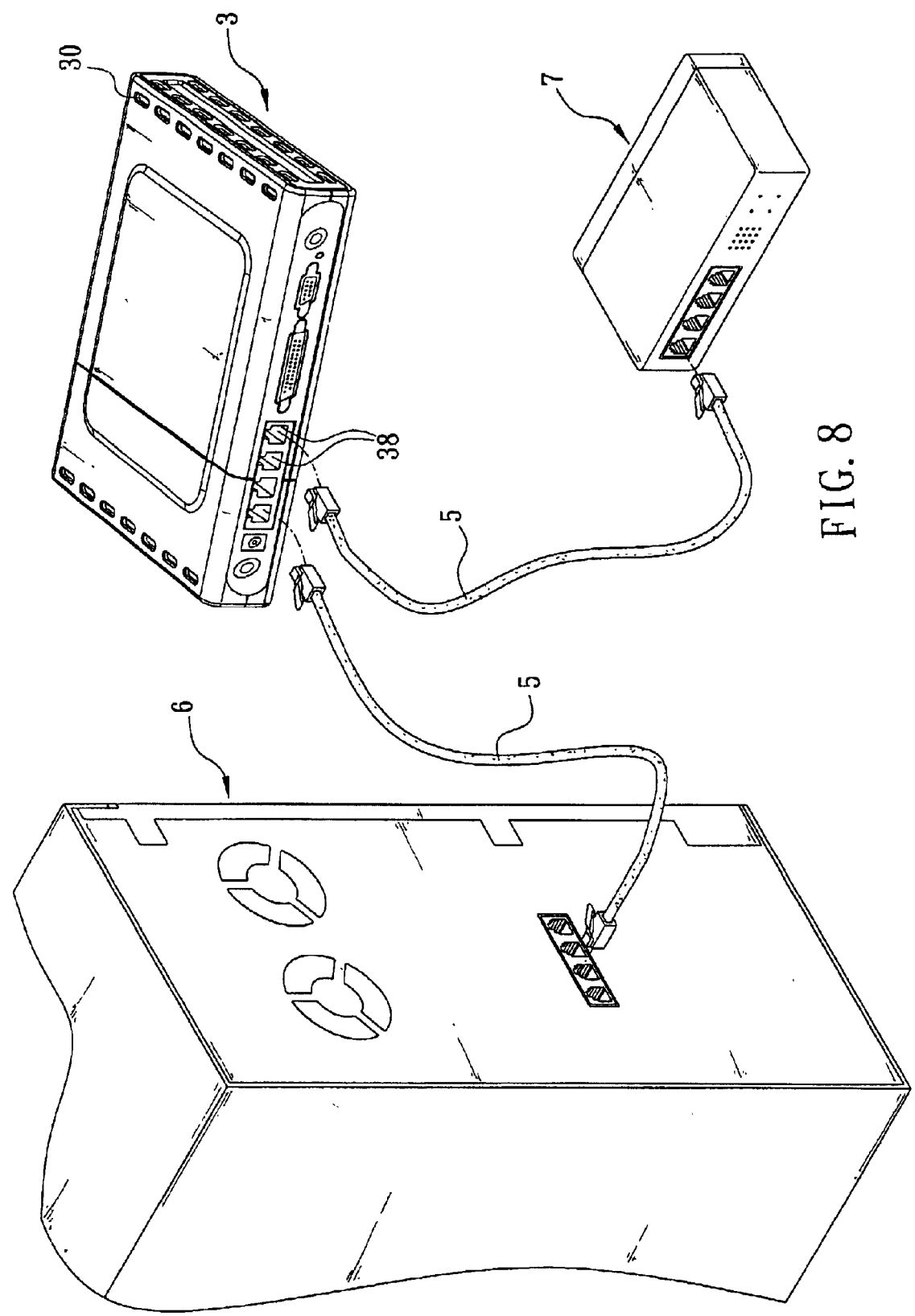
FIG. 8 is a perspective view showing a connection of two network devices and an electronic device.

Referring to FIGS. 5 and 8, in the embodiment the slots 30 at one side of the housing 3 are arranged parallel adjacent edges of the housing 3 in a pairing relationship. As a result, the housing 3 can be stably supported on a horizontal supporting surface after the pads 4 have been inserted in the slots 30.

While the invention has been described by means of specific embodiments, numerous modifications and variations could be made thereto by those skilled in the art without departing from the scope and spirit of the invention set forth in the claims.

What is claimed is:

1. A structure of network device comprising:
   a parallelepiped housing for enclosing the network device;
   a plurality of slots on two opposite sides and two opposite edges at each of an underside and a top of the housing; and
   a plurality of pads each fastened to one slot of the housing of the network device for projecting a portion thereof from a surface of the housing, the portion of the pad being fastened to one slot of a housing of an adjacent network device for maintaining a predetermined distance between two coupled housings, and each pad is shaped as a cross and includes an upper upright inserted into the slot of the housing of the network device as the pad is fastened to the slot, a central horizontal bar projected from one side of the housing, and a lower upright projected from the bar into the slot of the housing of the adjacent network device for maintaining the predetermined distance between two coupled housings, the predetermined distance being equal to a thickness of the bar.

2. The structure of claim 1, wherein the housing comprises at least one interior circuit board having a variety of electronic components mounted thereon, the electronic components being enabled to generate signals for connecting to a network.

3. The structure of claim 1, wherein the housing further comprises a display panel and a plurality of ports formed on a side of the housing without the provision of the slots, the display panel having a plurality of light emitting elements electrically coupled to the circuit board, and the ports being connectable to a cable for signal communication.

4. The structure of claim 1, wherein the housing further comprises an opening in an inner wall having the provision of the slots distal from a side of the housing so that in response to a coupling of a first portion of the slots on the housing to the pads and a disconnection of a second remaining portion of the slots on the housing from the pads, the housing is in communication with the outside of the housing.

5. The structure of claim 4, wherein the upper upright comprises a ridge at either side, the ridges being urged against inside of the opening after the pad has been inserted into the slot.

6. The structure of claim 1, wherein the housing further comprises an opening at a junction of a bottom and the inner wall of the slots so that in response to a coupling of a first portion of the slots on the housing to the pads and a disconnection of a second remaining portion of the slots on the housing from the pads, the housing is in communication with outside.

7. The structure of claim 6, wherein the lower upright comprises a ridge at either side, the ridges being urged against inside of the opening after the pad has been inserted into the slot.

8. The structure of claim 1, wherein each of the pads is formed of a flexible material.

9. The structure of claim 1, wherein the slots at one side of the housing are arranged parallel adjacent edges of the housing in a pairing relationship.

* * * * *